United States Patent [19]

Bujagec et al.

[11] Patent Number: 5,095,627
[45] Date of Patent: Mar. 17, 1992

[54] METHOD FOR MOUNTING OF SEMICONDUCTOR CRYSTALS

[76] Inventors: Evgneius S. Bujagec, Taikos ulica, 223; Vaclav V. Prokopovich, Algirdo ulica, 51 A, both of Vilnius, U.S.S.R.; Janos Bocsanczy, Höllsteinstrasse 82, 6380 Bad Homburg, Fed. Rep. of Germany

[21] Appl. No.: 530,584

[22] Filed: May 31, 1990

[51] Int. Cl.$^5$ ............................................. H05K 3/30
[52] U.S. Cl. ..................................... 29/832; 361/400
[58] Field of Search ................................ 29/832-835, 29/841; 361/400, 404, 405

[56] References Cited

U.S. PATENT DOCUMENTS

| | | | |
|---|---|---|---|
| 3,379,937 | 4/1968 | Shepherd | 361/400 |
| 4,062,107 | 12/1977 | Blackman et al. | 29/834 |
| 4,667,401 | 5/1987 | Clements et al. | 29/832 |
| 4,715,115 | 12/1987 | King et al. | 29/841 |

FOREIGN PATENT DOCUMENTS 1-35051  5/1989  Japan ................................ 361/400

Primary Examiner—P. W. Echols
Attorney, Agent, or Firm—Larson and Taylor

[57] ABSTRACT

A process is provided for the mounting of semiconductor crystals with integrated circuits or circuit elements on a base support. In the first stage of the process, the front surface of a semiconductor crystal (1) and, substantially coplanar exposed contacts (6) on this surface, are bonded over the entire surface thereof to the base support by a dielectric substance. In a second stage, the contacts are at least partially exposed by partial etching away of the crystal (1). In the last stage, conductive connections (7) to the contacts are produced by coating of an electrically conductive material onto the base support.

19 Claims, 2 Drawing Sheets

METHOD FOR MOUNTING OF SEMICONDUCTOR CRYSTALS

FIELD OF THE INVENTION

The invention relates to a method for mounting of semiconductor crystals, having on the front surface thereof substantially coplanar exposed contacts, on a base support or substrate, the method including the mechanical attachment and the provision of the conductive connections. Such a method can be used in the manufacture both of single crystal integrated circuits (IC) and of hybrid integrated circuits (HIC).

BACKGROUND OF THE INVENTION

In the manufacture of hybrid integrated circuits the manner in which the crystals are connected to, i.e., mounted on, the substrate or base support is highly important. The most widely used method of connection of the crystal is by wire. This method is relatively simple and is suitable for all types of crystals. With this method, the semiconductor crystals are connected by means of a eutectic or adhesive or are securely connected in some other manner to the base support, and then the conductive wires are welded ultrasonically or are bonded by thermocompression. The method is obviously highly labor intensive and despite the labor required, the conductive connections are not dependable and have only a low mechanical capacity to carry charges. Also, the electric parameters of the connections are very high (so that the increase in switching frequency is limited) and these parameters can vary from part to part.

Mounting methods or processes are also known which provide for the use of crystals with spherical, columnar, bar-shaped or other specially shaped outputs or contacts. The manufacture of semiconductor crystals with such special contacts however is technologically complicated and costly Also, in the case of constructions of this type there are always problems with monitoring the quality of the electric connections, problems with heat exhaust or withdrawal (heat sinking) from the crystal and problems with the high ratio of low-quality goods produced by this method.

In order to avoid the aforementioned problems, a process is described in British Patent 21 30 794 wherein the crystals are first placed face down on an auxiliary substrate and are covered with epoxy resin by casting from the reverse side forward. Following hardening of the epoxy resin, the crystals in the resin are separated from the auxiliary substrate, and then multi-layer conductive strips are applied by means of photopolymer paste.

This method or process has the advantage that the contact surfaces are accessible on the front face of the crystal and production of the connections is relatively simple. The mechanical strength of the connections with the substrate or base support is good. The linearity of the HIC surface is also advantageous.

However, there are also drawbacks which stand in the way of wider use of the process. Some of these drawbacks include the poor heat exhaust or withdrawal provided and the ultrahigh frequency (UHF) characteristic which requires the use of undesirable, quite low frequencies. Further, the synthetic resins deteriorate rapidly, and the base support is of low mechanical strength. The polymer conductors also have remarkably poor mechanical and electrical characteristics or parameters. Finally, special photosensitive paste material must be used.

There are other known methods which work with base supports made of inorganic materials, for instance of silicon, anodized aluminum or ceramic (Japanese patent No. 56-48 23). This type of process generally involves the provision of through-holes or blind holes in the support, into which the crystals are subsequently introduced. From the reverse side of the crystal, glass, polysilicon or some inorganic dielectric substance is then coated on. The HIC formed in this manner is flat and can be provided by vacuum-vapor-metallizing with conductive strips directly to the contact surfaces of the semiconductor crystals.

One drawback of all of the methods is that it is very difficult to attain flat, horizontal or level borders of the material. As a result, these methods are not suitable for the production of multicrystal HIC. Also, the plurality of boreholes provided decreases the mechanical strength of the base support as well as the overall construction. Further, the production of such boreholes, which must be highly accurate in their location and dimensions, is very costly and cannot, as a practical matter, be automated. In addition, the HIC constructions are susceptible to cyclical temperature deviations.

Another known method is that disclosed in U.S. Pat. No. 3,903,509, entitled "Semiconductor-Thermoplastic-Dielectric Substance Process," wherein the semiconductor crystals are fastened to the base support, thereafter a plurality of columns, stanchions or electric piles are drawn galvanically upward to a desired height, a dielectric material is laid on as cover, this mounting is opened at certain points, and conductive strips are mounted on top.

The advantages of this method include the great mechanical strength and the high degree of reliability in the manufacture of the conductive connections. The drawbacks include a limited frequency range on account of the transfer columns from one layer to the other, the requirement of placing the semiconductor crystals with great precision on the base support and the need to maintain the planar geometry of the crystals and the columns, stanchions or electric piles, so that the use of crystals of various heights is also not possible. Also, very complicated galvanic procedures are required in order to guarantee the exact column height, and it is not possible to assemble a plurality of crystals closely adjacent to one another.

The prior art method which is perhaps closest in concept to that of the present invention is the method disclosed by Schmid and Melchior in "Coplanar Flip-Chip Mounting Technique for Picosecond Devices," published in the Journal Rev. Sci. Instrum. 55 (1984), No. 11, pages 1854–1858. This process involves the steps set forth below which are described in relation to FIGS. 1 to 4 of the drawings.

First, as shown in FIG. 1, ultrahigh frequency (UHF) conductive strips CS1 and CS2 are provided, respectively, on a substrate or foundation (base) support S and a semiconductor crystal C. Then, as shown in FIG. 2, solder S0 and fluxing medium FM are applied to the substrate or base support. Subsequently, the single crystal C is mounted, as illustrated in FIG. 3, on the base support S with the contacts CS2 located on its front face. Finally, as shown in FIG. 4, the soldering takes place in a reducing atmosphere to produce the article illustrated.

Considering this process in more detail, an optical electronic structural element (C) of semiconductor crystal GaAs with coplanar (located in the same plane), tapering conductive strips (CSR) thereon is laid, with the side on which these strips are located, on a sapphire substrate or base support (S). The base support (s) is likewise provided with tapering, coplanar conductive strips (CS1). A 4 micrometer (mcm) thick indium layer has been applied on all of the contact surfaces of the base support beforehand by electrochemical means, and then a thin colophonium (resin) layer has been applied. The crystal is brought into the correct position under a microscope. The colophonium series as adhesive. Then in a $H_2$ atmosphere the soldering occurs at 250° for 30 seconds. In this process the colophonium serves as the fluxing medium. Then the colophonium residue is removed with acetone, and the crystal is surrounded with silicon rubber for protection.

Some important advantages of this known process are the relatively great mechanical strength and the suitability of the conductive connection between the crystal and substrate for the UHF-range. Thus it is possible to connect semiconductor crystals in the order of magnitude of a few microns to other semiconductor crystals in the order of magnitude of a few 100s or 1000s of microns. It is also advantageous that no holes need to be drilled in the substrate. On the other hand, the same drawbacks are present as in the prior art "flip-chip" method, which drawbacks include: the heat exhaust or drawing off occurs only through the soldered points or seams, the checking of the solder connections is made more difficult, the soldering requirements and conditions are complicated, special solder-activating components are needed, and the metal coating on both parts are not easily solderable. Also, complete removal of the colophonium between foundation support and crystal is not really possible, and the mounting surface of the crystal must be considerably larger than the surface of the active element, so that, in other words, only a slight benefit arises from the use of costly semiconductor materials. In the cited example above having, for instance, a surface of the active element smaller than 50 $mcm^2$, a crystal is used with a mounting surface of at least 4 $mm^2$ with the result that only one eighty-thousandth of the surface of the costly GaAs crystal is used. Finally, the problem exists that moisture from the air collects in the narrow gap between the substrate and the crystal, thereby negatively influencing the electrical properties of the connection and thus accelerating metal corrosion, which then can lead to breakdown of the structural element.

SUMMARY OF THE INVENTION

An object of the invention is to provide a process of the aforementioned type wherein the quality of the product produced by the process is improved.

This object is attained according to the invention by providing that the semiconductor crystals, including their front face and their entire surface, are bonded (e.g., cemented) to the substrate base or support by means of a dielectric substance, then the contacts are, in turn, exposed at least partially, and thereafter conductive connections to the contacts are produced by coating of an electrically conductive material on the substrate or support.

An important and remarkable difference between the method according to the invention and the prior art method just discussed above resides in that, in contrast to FIG. 1, no UHF-conductive strips need be created (built up) on the semiconductor crystal. The crystal is provided only with simple contact surfaces incorporated in its front surface which is cemented by means of a very thin dielectric layer to the substrate provided with corresponding conductive strips Subsequently, with the removal of material from the semiconductor crystal, the contacts are at least partially exposed so that they are accessible from the outside. The contacts of the crystal and the conductive strips of the substrate lie almost in the same plane (e.g., there is a height of level differential of only about 1-3 mcm), so that capacitances formed by or at the connection points or seams which otherwise are critical in the UHF-range are practically eliminated.

In relation to the aforementioned "flip-chip" process discussed above, it is to be noted that in that process the fastening by means of special mounting surfaces occurs only at or on the contact surfaces. In the method according to the invention, the crystal is, in contrast, attached over its entire surface to the substrate, and, therefore, no special treatment of the crystal contact surface is required beforehand. In other words, there is no need for the construction of special supports, stanchions or electric columns or piles or the like. The method of the invention also provides remarkably higher mechanical reliability during operation.

The method according to the invention has the further advantage that the removal of a part of the material from the crystal makes this crystal lighter in weight and thus also less sensitive to mechanical disturbances or interferences. The arrangement of the contact surfaces of the crystal and the conductive strips in essentially the same plane on the substrate allows for cooperative utilization of the contact surfaces of the crystal to also serve as part of the tapering UHF-conductor strips, so that the maximum possible UHF-wave range of operation is attained with this construction. Also, because of the large transmission surface (the entire front surface of the crystal) and the minimum layer thickness of the dielectric substance, the heat exhaust or conduction (heat sinking) is improved, chiefly in that the heat source is located directly adjacent to the substrate conducting the heat away.

Known etching processes are suitable to supply the erosive action on the material of the semiconductor crystal, as is required to expose the contracts. The etching of semiconductor plates and crystals is widely practiced. For selective treatment, a technically very costly photolithographic process is generally used. On the other hand, an isotropic etching method without photolithography can be used for the process according to the invention. Thus the surfaces which are not connected to the substrate are etched simultaneously. Proceeding then from a certain predetermined height of the crystal, said crystal is etched in such a manner that a predetermined mass of the crystal still remains behind, when the contact surfaces have been exposed to some desired extent and have been made accessible. For that, the height of the crystal must be in accordance with the following conditions:

$$h < t \cdot Vv$$

wherein t is the etching time; and Vv is the perpendicular or orthogonal etching velocity.

The etching is carried out precisely according to the following formula:

$$t = \frac{a+b}{Vh}$$

wherein
a is the distance between the side crystal edge and the contact
b is the length of the contact surface, measured in the same direction as the distance a
Vh is the side or lateral etching velocity.
The result is then:

$$h > \frac{(a+b)Vv}{Vh}$$

When the side and perpendicular etching velocity are identical, the following condition remains:

$$h > a + b$$

which is practically always fulfilled.

The new mounting method of the invention is similar to the mounting technique for a crystal with bar-shaped outputs. However, the method according to the invention differs from that mounting technique in that the crystal is treated when the crystal is already connected tightly with the support. Application of a thick metal layer for bar-shaped outputs is no longer a problem, and the original dimensions of the crystal can be any that are desired. Also, with the process according to the invention, no disturbing potential arises at the connection points with the contacts.

It is very important that the final dimensions of the crystal can be made to be considerably smaller than the original dimensions thereof. Interesting perspectives in submillimeter-UHF-technology are thus opened. Further the reduction of the dimensions of the crystal also leads to a reduction of thermo-mechanical stresses in the body of the crystal and in the attachment layer as a result of the different expansion coefficents of the materials which are being connected with one another.

Other features and advantages of the invention will be set forth in, or apparent from, the following detailed description of preferred embodiments of the invention.

DESCRIPTION OF THE PREFERRED EMBODIMENTS

Figure 1:
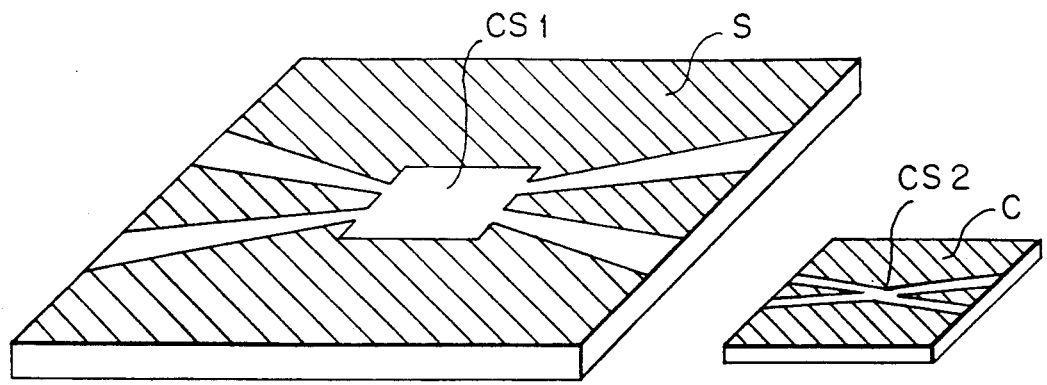
FIGS. 1 to 4 have been described above. The method of the invention is discussed in greater detail hereinafter relative to FIGS. 5 to 7 which are cross-sectional views of exemplary embodiments of the invention.
Figure 2:
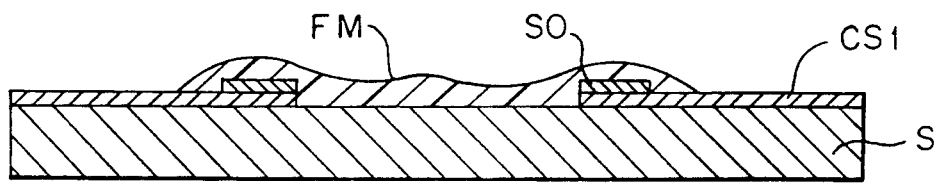
Figure 3:
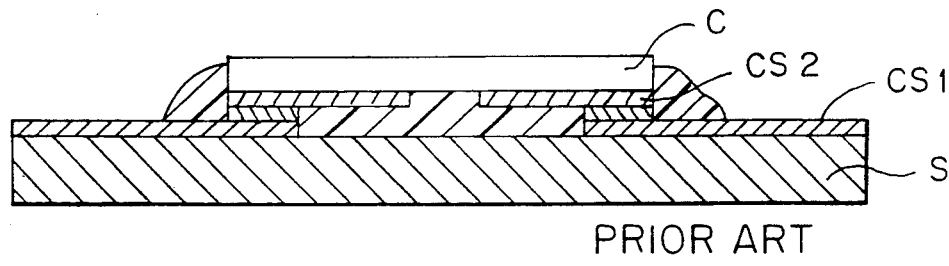
Figure 4:
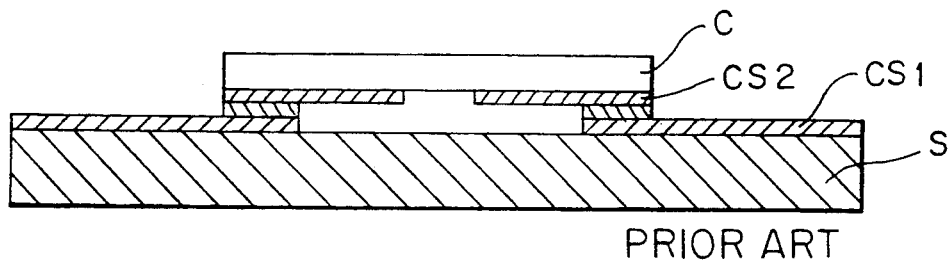

In accordance with an exemplary embodiment, the method or process of the invention begins with the placement and attachment of crystal 1 on a substrate or base support 2. A ceramic plate with dimensions 24×30×0.5 mm can be used as the substrate 2. Aluminum conductive strips 3 are provided in a predetermined arrangement on plate 2, and strips 3 are approximately 0.8 mcm thick. Before being used, the plate 2 is cleansed with an acetone absorption material.

A Sw crystal (IC) of 1.2×1.2×0.4 mm dimensions can be used as crystal 1 of the device. A light sensitive adhesive formed on a polymethacrylate base is coated onto the front face of the crystal 1. A piece of textile batiste of 60×50 mm dimensions is used for that purpose, after soaking the batiste in adhesive, before it is used to cover the front surface of the crystal 1, so that the adhesive moistens the crystal surface.

Following placement of the crystal 1 on the substrate 2 in such a manner that the contact surfaces of the crystal 1 engage the corresponding conductive strips 3 of the substrate 2, the crystal 1 is subjected to a stream of compressed air along with radiation with UV light. The UV radiation lasts for approximately 50-70 seconds. The radiation penetrates and pervades the substrate 2 and causes hardening of the adhesive film, indicated at 4 in FIG. 5, between crystal 1 and substrate 2. The pressed out adhesive residues do not harden, because the oxygen of the air in this case prohibits photopolymerization of the adhesive by acting as an inhibitor. These residues are washed out with a mixture of isopropyl alcohol and acetone in a ratio of 3:1. The quality of cleaning is monitored with a suitable microscope.

Figure 5:
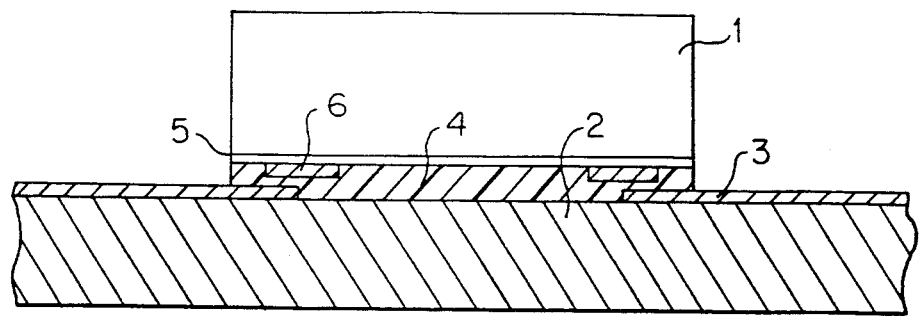
Figure 6:
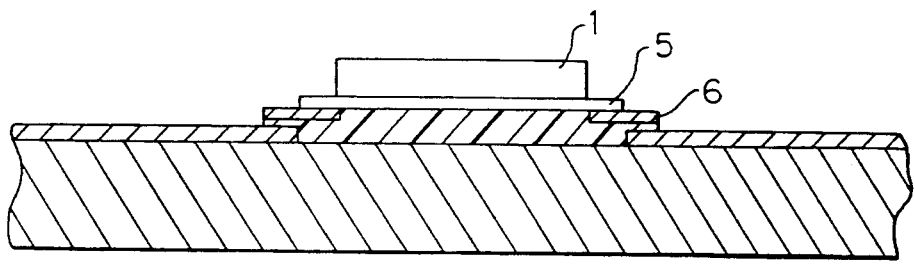

The next operation (see FIG. 6) is the etching of crystal 1 for exposure of the contacts 6 which are completely hidden or occluded only following the adhesive process which is shown in FIG. 5. These contacts 6 could be aluminum and for instance each, in turn, could have a contact surface of 100×100 mcm. The distance from the side edge or border of the crystal is 50 mcm. A plasma chemical process in a SF6:Ar gas mixture is used for the etching. The component consumption is 2.4 resp. 8.7 liters/hour, the effective power is 3.7+/−0.1 kW and the working pressure is 30+/−2 Pa. The etching velocity is approximately 1.2-1.5 mcm/minute. The etching occurs in two phases. First, approximately 40-50% of the contact surfaces are exposed, then a $SiO_2$ layer 5, which is formed on the downwardly facing front surface of crystal 1, and which, prior to this time has covered the newly exposed contact surface, is etched away. For this purpose one uses the same installation, but uses Chladon 218. Its consumption is 1.5+/−0.1 liters/hour, the effective power is 2.8+/−0.1 kW, the working pressure is 15-110 Pa and the etching velocity is 0.11-0.12 mcm. Next the material of the semiconductor crystal (which is silicon in this example as described above) is etched once again, until portions of the contact surfaces are entirely exposed, except for being partially covered by the $SiO_2$ layer 5, as shown and described above relative to FIG. 6.

It is noted that the expression "substantially coplanar" is used in the specification and claims to describe the relationship between the contacts 6 and the front surface of crystal 1. While this expression might appear from the showings in FIGS. 5 to 7 to be inaccurate (in that the front (lower) surface of the contacts 6 is not coplanar with the front surface of the epitaxial layer 5 of the semiconductor crystal 1, the layer thickness in the drawings are greatly exaggerated. The phrase or expression "substantially coplanar" is used because in practice the contacts 6 are so flat that in the process of bonding (cementing) the crystal to the substrate it is as if two flat surfaces are being bonded together.

Figure 7:
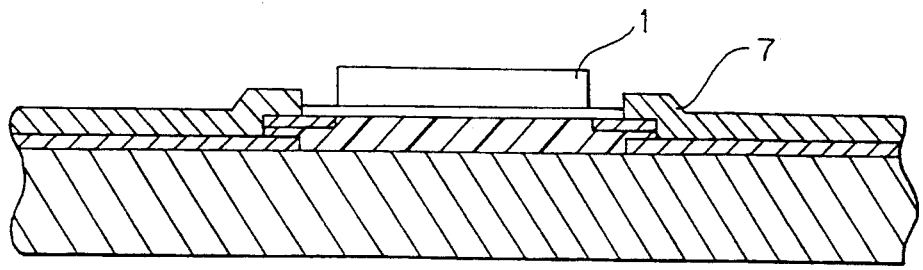

There then follows a process to produce the conductive connections, indicated at 7, which are connected to contacts 6 so that finally the arrangement as in FIG. 7 is obtained. Several methods are available for production of the conductive connections, and some of these are described hereinafter as examples.

EXAMPLE 1

Production of the Conductive Connections by Vapor Deposition of Metal Using a Screen For this method the aluminum surface is first suitably pretreated. The ceramic plates are immersed in 5-7% sodium hydroxide solution at approximately 60°-70° C. and for approximately 1-2 minutes. Then the plates are washed off with deionized water and are dried in a dust-free air flow. Then they are placed into a bath containing a zinc solution of the following composition:

| | |
|---|---|
| ZnO | 45-50 g/l |
| NaOH | 450-500 g/l |

The bath is at room temperature and the duration of immersion is approximately 15-30 seconds. During this time the plates are moved back and forth continuously. The zinc layer which is thus formed is to be uniform, i.e., without light or dark spots, or else the process is repeated. Then the parts are washed in deionized water and are dried. Then the zinc layer is etched with 10-20% nitric acid for approximately 10-20 seconds, and then washed and again in the same manner is immersed in the zinc solution, this time for approximately 8-10 seconds. Then the plates are again washed, as before, and dried.

Following the application of the zinc contact layer the base supports are covered with a relief mask and are placed in the vapor deposition chamber. The mask consists of a bronze foil, with thickness approximately the same as or greater than the height of the crystal. In the example, the crystal height is 100+/−10 mcm. A foil BrB2 of 100 mcm thickness is used in this example. The foil is coated on both sides with photoresist. Thereafter the foil is exposed on one side to the pattern of the conductive connections, and on the other side to the pattern of the conductive connections as well as also the crystal support surface so that after exposure, the patterns are provided on the foil in a manner similar to the exposure of film for a camera. Then, in a conventional manner, part of the photoresist is removed. Nickel electrolytes are then galvanically coated onto both sides of the exposed surfaces, the nickel electrolytes of the following composition:

| | |
|---|---|
| Ni(NH$_2$SO$_3$).4 H$_2$O | 500-600 g/l |
| NiCl$_2$.6 H$_2$O | 5-6 g/l |
| H$_3$BO$_3$ | 30-40 g/l |
| sodium lauryl sulfate | 0.1-0.15 g/l |
| pH level | 3.2-3.8 |
| temperature | +55 +/−5° C. |
| current density | 0.9 A/cm$^2$ |

The nickel coating is 5-8 mcm thick. Then the photoresist is removed and the bronze foil in the "open window" is etches with an etching solution HNO$_3$: H$_2$O, 2:1, i.e., the etching solution is applied to the exposed surfaces. In the area of the crystal support surface the metal of the foil must be etched away from the one side through its entire thickness, i.e., as far as the nickel layer coated on the other side. This then allows for engagement of the mask tightly in sealed relation to the surface of the substrate despite the crystal attached to the substrate. The apertures or windows in the mask corresponding to the conductive connections are 10-15 mcm narrower than the corresponding conductive strips, in order to increase the accuracy in placement of the mask on the conductive strips. Finally, conductive connections 7 are produced by application of a 5-5.5 mcm thick copper layer through the mask.

EXAMPLE 2

Production of Conductive Connections by Means of Laser Pantography

In this case the cleansed substrates are inserted into a chamber having a transparent pane serving as viewing window. The plane of the plate is parallel to the plane of the pane. The chamber is filled with vaporous aluminum-triisobutyl in the hydrogen flow under 40-50 Pa pressure. A laser beam outline the relevant pattern of the conductive connections. The effective power of the laser is 5-1000 W/cm$^2$. It is possible to use a multi-mode Ne laser, of which the beam diameter is 20-30 mcm. The temperature at the impact point of the laser beam is at 220°-260° C. At this temperature the aluminum-triisobutyl vapors are dissociated, and aluminum is caused to drop out. In order to attain a layer thickness of 2-2.5 mcm, one must radiate the points in question a plurality of times.

EXAMPLE 3

Production of Conductive Connections by Precipitation Out of a Nickel Solution Using a Laser As described in Example 1, the substrate (plate) is likewise pretreated. Following the zinc coating, the plate is inserted into a container with a window pane in such a manner that the plate lies parallel to the plane. A nickel solution of the following composition is pumped through the container;

| | |
|---|---|
| NiSo$_4$ | 22-25 g/l |
| NaH$_2$PO$_2$ | 15-20 g/l |
| 40% lactic acid | 35-40 g/l |
| thiouric acid | 0.001-0.002 g/l |
| H$_3$BO$_3$ | 10-15 g/l |
| ammoniac | 11-12 g/l |
| pH | 4.6-5.6 |

The temperature of the solution is 20°-25° C. A multi-mode-Ne-laser with 1-200 W/cm$^2$ effective power and a beam diameter of 30-50 mcm is used for the precipitation. The temperature attained in this manner is 90°-100° C. on the surface. Nickel is then precipitated out, is deposited on the substrate and forms the conductive connections. With one beam transmission, a 0.40-0.6 mcm thick metal layer is attained. A plurality of transmissions are then used to obtain a layer thickness of 3-4 mcm.

EXAMPLE 4

Production of Conductive Connections by Nickel Chemical Precipitation

The process begins with pretreatment of the aluminum surfaces as described in Example 1. The nickel solution which is used as described in Example 3. The solutions temperature is 80°-90° C., the effective power for production is 100 cm$^2$/liter. The thickness of the nickel laser depends upon the length of treatment. In 30-40 minutes it reaches about 8-11 mcm thickness. Following the nickel application, the base supports are washed and dried.

The process according to the invention differs from the known processes because of the following advantages:

It is a reliable process for large scale and series production, in which in each step of the process a plurality of contacts of the semiconductor crystals can be treated simultaneously with their conductive connections;

The front surface of the crystal is protected by the substrate itself against outside negative effects;

Without boreholes, and independently of the material, in the final state the contact surfaces of the crystal and the conductive connections are located essentially on the same plane;

Disturbing contact surface capacitances are avoided;

The UHF-conductive strips extend to the contact surfaces or incorporate said surfaces;

The heat source of the crystal lies directly adjacent to the heat-sinking substrate;

The height of the crystal can be reduced to the epitaxial layer;

The conductive connections can be monitored visually;

Crystals with damaged or very small contact surfaces can also be used;

Any metal which is suitable for electric contacts can be used for the contact surfaces;

The thermal mechanical stresses resulting from different linear expansion coefficients of the substrate, on the one hand, and of the crystal, on the other hand, can be maintained at a very low level.

In view of the foregoing, it will be appreciated that with the method of the invention a maximum possible output of high quality, dependable, watertight and rapidly exchangeable parts is obtained with great mechanical strength and optimum heat exhaust or withdrawal with very close mounting. Also the method is relatively simple to carry out and can be easily automated. All communicating connections between the crystals can be arranged on the substrates beforehand and following checking these are ready for direct assembly.

Finally, it should be emphasized again that the process according to the invention is based on only standard conditions or requirements for crystal production, viz., the contact surfaces must be located in the peripheral area, and between the contact surfaces there can be no operational elements aside from the those required for production.

Although the present invention has been described relative to specific exemplary embodiments thereof, it will be understood by those skilled in the art that variations and modifications can be effected in these exemplary embodiments without departing from the scope and spirit of the invention.

What is claimed is:

1. A method for the mounting on a substrate of a semiconductor crystal having contacts on the surface of the front face thereof substantially coplanar therewith, said method comprising first bonding the front face of the crystal over the entire surface thereof to the substrate by means of a dielectric material, then at least partially exposing the contacts of the crystal and thereafter applying electrically conductive material to exposed portions of the contacts and to the substrate to provide conductive connections.

2. A method as in claim 1, wherein the dielectric material comprises a polymerized anaerobic compound.

3. A method as in claim 1, wherein said dielectric material comprises a light sensitive adhesive.

4. A method as in claim 1 wherein the contacts of the crystal are exposed by etching using a chemical liquid.

5. A method as in claim 1 wherein the contacts of the crystal are exposed by plasma chemical etching.

6. A method as in claim 1 wherein the substrate comprises a ceramic.

7. A method as in claim 1 wherein the substrate comprises a moncrystalline semiconductor.

8. A method as in claim 1 wherein the substrate comprises a polycrystalline semiconductor.

9. A method as in claim 1 wherein the conductive connections are produced by metal coating.

10. A method as in claim 1 wherein the conductive connections are produced by metal coating with subsequent photolithography.

11. A method as in claim 1 wherein the conductive connections are produced by precipitation of metal from a salt solution using a laser beam.

12. A method as in claim 1 wherein the conductive connections are produced by thermal dissociation of a gaseous metallic organic compound.

13. A method as in claim 1 wherein the conductive connections are produced by chemical precipitation of metal from a liquid solution.

14. A method as claimed in claim 1 wherein the conductive connections are produced by precipitation of metal from a gaseous metallic organic compound by means of laser beam.

15. A method as in claim 1 wherein the contacts of the crystal are exposed by etching and said etching of the crystal occurs simultaneously on all exposed surfaces thereof.

16. A method as in claim 15, wherein said etching is used to expose a part of one side surface and the reverse side of the contacts.

17. A method as in claim 15 wherein said etching occurs in a plurality of stages in which the crystal is first etched away over an epitaxial layer covering the reverse side of the contacts as far as substantially half of the contact surface, the epitaxial layer is then etched away as far as substantially half of the contact surface, an the crystal is then etched away over the epitaxial layer essentially over the entire contact surface.

18. A method in claim 1 wherein during the production of the conductive connections the electrically conductive material is coated onto the substrate and onto exposed ares of the contacts on the surface thereof opposite that which is exposed prior to bonding of the crystal.

19. A method as in claim 1 wherein prior to bonding of the crystal to the substrate, conductive strips are provided on the substrate and, after said bonding and said partially exposing of the contacts, the electrically conductive material is coated on the conductive strips to provide the conductive connections.

* * * * *